(12) United States Patent
Wong et al.

(10) Patent No.: US 7,025,243 B2
(45) Date of Patent: Apr. 11, 2006

(54) BONDHEAD FOR WIRE BONDING APPARATUS

(75) Inventors: Yam Mo Wong, Singapore (SG); Ka Shing Kenny Kwan, Singapore (SG); Chong Hao Chen, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 10/870,400

(22) Filed: Jun. 16, 2004

(65) Prior Publication Data

US 2005/0279805 A1    Dec. 22, 2005

(51) Int. Cl.
*B23K 37/00* (2006.01)
(52) U.S. Cl. .................. 228/4.5; 228/180.5
(58) Field of Classification Search ............... 228/4.5, 228/180.5
See application file for complete search history.

(56) References Cited

U.S. PATENT DOCUMENTS

| | | | | |
|---|---|---|---|---|
| 3,216,640 A | * | 11/1965 | Szasz | 228/4.5 |
| 3,806,019 A | * | 4/1974 | Diepeveen | 228/4.5 |
| 4,213,556 A | * | 7/1980 | Persson et al. | 228/104 |
| 4,234,117 A | * | 11/1980 | Foulke | 228/4.5 |
| 5,277,355 A | * | 1/1994 | Weaver et al. | 228/4.5 |
| 5,868,300 A | * | 2/1999 | Babayan | 228/180.5 |
| 6,102,275 A | * | 8/2000 | Hill et al. | 228/180.5 |
| 6,435,399 B1 | * | 8/2002 | Ikoma | 228/104 |
| 6,616,030 B1 | * | 9/2003 | Miller | 228/4.5 |

FOREIGN PATENT DOCUMENTS

JP          59-220939 A  * 12/1984

* cited by examiner

*Primary Examiner*—Lynne R. Edmondson
(74) *Attorney, Agent, or Firm*—Ostrolenk, Faber, Gerb & Soffen, LLP

(57) ABSTRACT

A bondhead is provided that comprises a bondhead body for holding a bonding tool, such as an ultrasonic transducer, and a bondhead actuator coupled to the bondhead body for moving the bonding tool with respect to a bonding surface. A wire clamping device, which may comprise a wire clamp holder and a wire clamp, is movable relative to the bondhead body for feeding a bonding wire to the bonding tool. A wire clamping device actuator is operative to move the wire clamping device relative to the bondhead body for improved control of the feeding of bonding wire to the bonding tool.

18 Claims, 9 Drawing Sheets

BONDHEAD FOR WIRE BONDING APPARATUS

FIELD OF THE INVENTION

The invention relates to a wire bonding apparatus for making electrical wire connections on semiconductor devices, and in particular to a bondhead of such a wire bonding apparatus.

BACKGROUND AND PRIOR ART

In a wire bonding process, electrically conductive wires are bonded between electrical bonding pads found on semiconductor devices, such as between a semiconductor die and a substrate onto which the die is attached. The substrate is usually a semiconductor leadframe. The electrical connection could also be made between bonding pads found on separate semiconductor dice. The bond is formed by a bonding tool which may be in the form of a capillary attached to an ultrasonic transducer for generating ultrasonic energy to the capillary tip.

In modern day wire bonders for making so-called "ball-bonds", a bondhead which carries the bonding tool is designed to execute a rocking motion about a suitably located pivot. For ultrasonic bonding, the bonding tool is an ultrasonic transducer mounted onto the bondhead, the ultrasonic transducer comprising a piezoelectric driver stack coupled to a horn, and a capillary at an end of the horn. Bonding wire, which is typically made of gold, aluminum or copper, is fed from a spool of bonding wire through a hole in the capillary to the tip of the capillary. Bonding is done by welding the wire at the tip of the capillary to the bonding pad through the application of ultrasonic energy to the capillary tip.

It is common to utilize a wire clamp to control feeding of bonding wire to the capillary tip. For example, the clamp may be closed to hold onto and fix a length of wire relative to the capillary, or opened to allow wire to slide through the capillary. The wire clamp is also closed to hold the wire in position during the making of wire bonds on the bonding pads. The clamp is further commonly used to facilitate looping of a length of bonding wire between electrical bonding points on the die and/or substrate, and/or to pull and break wires from bonds after the bonds have been made. The wire needs to be held firmly, fed to the bonding site and stripped off at appropriate junctures in the process. Over the years, the operational speed of wire bonding machines has increased considerably, with the result that the wire clamp and bondhead need to be actuated at high speeds while exerting controlled force on the wire being clamped without damaging the wire.

FIG. 1 is an example of a prior art bondhead 100. The bondhead 100 generally comprises a bondhead body 102, a wire clamp 104 fixed to the body 102 and a transducer 106 mounted to the bondhead 100. The transducer 106 has a capillary 108 attached to one end of the transducer, and is generally movable in tandem with the movement of the bondhead 100.

Bonding wire 110 is fed from a spool of wire (not shown), and is relayed past the jaws of the wire clamp 104 and threaded through a hole in the capillary 108. The wire clamp 104 is arranged along the path of the bonding wire so as to control feeding of the wire to the capillary 108, in particular, to the capillary tip.

The bondhead body 102 is pivoted at a pivot point 112 for turning motion, and turning movement of the bondhead body 102 about the pivot point 112 is actuated by a bondhead actuator 114. The bondhead actuator 114 may comprise a voice coil motor including a coil that is movable relative to a magnet by way of electromagnetic interaction when current flows through the coil. When actuated by the bondhead actuator 114, the body 102 and wire clamp 104 are driven to turn along a turning arc 116. Bonding wire 110 is drawn from the spool of wire towards a bonding location when the wire clamp 104 is closed, and the bondhead 100 is turned away from the spool of bonding wire. The wire clamp 104 may further be opened and the bondhead 100 turned towards the spool in order to position the wire clamp 104 to clamp and draw more bonding wire 110.

During a bonding cycle and before starting to weld the first bond, a molten ball has to be formed at a tail end of the bonding wire 110 protruding out of the capillary tip. The molten ball is later lowered onto a bonding pad to form a first ball bond. The molten ball is formed at the end of this protruding bonding wire 110 by melting the wire through electro-sparking, so a sufficient length of wire must be available at the tail end of the bonding wire 110 to do so. An electronic flame-off ("EFO") device creates an electrical spark and melts the wire to form the molten ball.

To leave a tail of bonding wire 110 protruding from the capillary tip after completion of a bond, the bondhead 100 has to follow a variety of programmed motions. More specifically, during ball-bonding processes, the bondhead 100 needs to move up a short distance with the wire clamp 104 open after the bonding wire 110 has been welded at a second bond location to complete a wire connection. Then, the bondhead 100 stops and the wire clamp 104 is closed to clamp the bonding wire 110. After that, the bondhead 100 moves up further to a higher position. During this further upward motion, the bonding wire 110 is pulled up and broken at the second bond location, and gets ready for the start of the first bond of the next wire connection. This is called tail formation, to ensure that a predetermined length of bonding wire protrudes from the capillary tip after each wire connection is established. The consistency of the length and linearity of the protruding wire determines the repeatability of ball formation and the ball size formed.

Another feature of the prior art bondhead 100 is that it uses an air tensioner to ensure the centering of the bonding wire 110 and the molten ball with respect to the capillary tip. This is to ensure accuracy of placement of the bonded ball at the first bond. After EFO sparking, the formed ball is pulled up by the air tensioner to sit in a central position under the capillary 108. The consistency of ball centering relies on the stability of the pulling force exerted by the air tensioner. Therefore, periodic checking and cleaning of the air tensioner is required to ensure consistency of ball centering.

The existing tail-formation process has a number of drawbacks. One drawback is that it requires precise synchronization between operation of the wire clamp 104 and motion of the bondhead 100. This becomes much more difficult when the bondhead 100 moves at very high speeds and acceleration. The process is also very demanding on the stability of the bondhead structure and motion. It is difficult to produce consistently straight tails with uniform lengths when bonding wires of smaller and smaller diameters are used. Any variation in the process causes corresponding variation of the wire shape of the next bonded wire, resulting in inconsistency. Furthermore, operational stoppages can result when the bonding wire 110, especially thin bonding wire, is broken prematurely at the second bond location when the bondhead 100 moves up while the wire clamp 104 is still open. Additionally, more process time is required to form the protruding bonding wire 110 by manipulating the bondhead 100, so that bond cycle time is increased for each bonded connection.

SUMMARY OF THE INVENTION

It is an object of the invention to seek to provide an improved bondhead for a wire bonding apparatus that helps to reduce cycle time for making each bonded connection and also avoids some of the disadvantages associated with prior art bondheads.

According to a first aspect of the invention, there is provided a bondhead comprising: a bondhead body for holding a bonding tool; a bondhead actuator coupled to the bondhead body for moving the bonding tool with respect to a bonding surface; a wire clamping device which is movable relative to the bondhead body for feeding a bonding wire to the bonding tool; and a wire clamping device actuator for moving the wire clamping device relative to the bondhead body.

According to a second aspect of the invention, there is provided a method of bonding a wire comprising the steps of: forming a wire bond with a bonding tool; moving the bonding tool away from the wire bond while clamping the wire with a wire clamping device and releasing a length of wire between the wire bond and the bonding tool; then moving the clamping device and the bonding tool away from the wire bond while clamping the wire to separate the bonding wire from the wire bond.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of various embodiments of bondheads in accordance with the invention will now be described with reference to the accompanying drawings, in which.

DETAILED DESCRIPTION OF THE PREFERRED EMBODIMENTS

Figure 1:
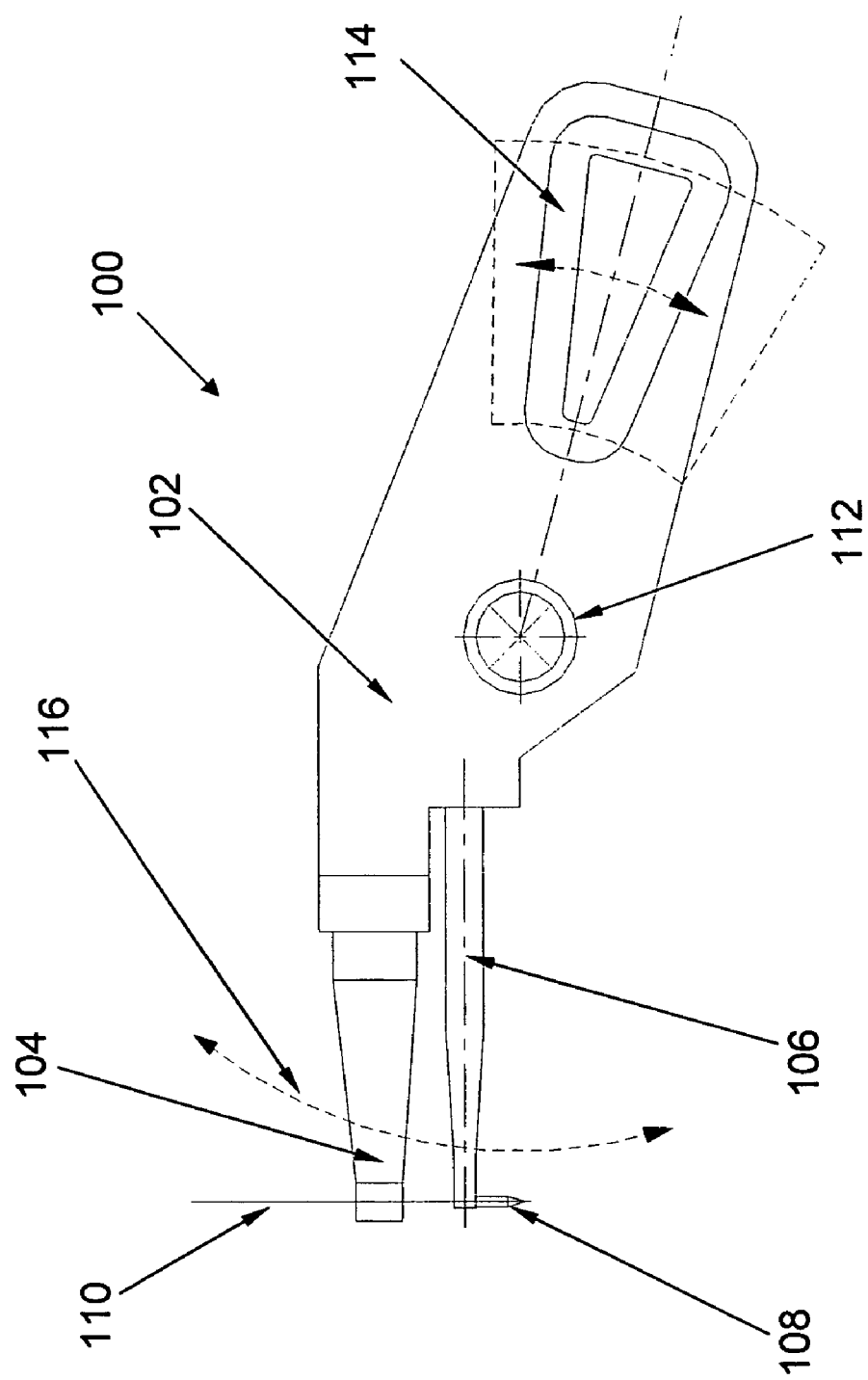
FIG. 1 is a side view of a prior art bondhead.
Figure 2:
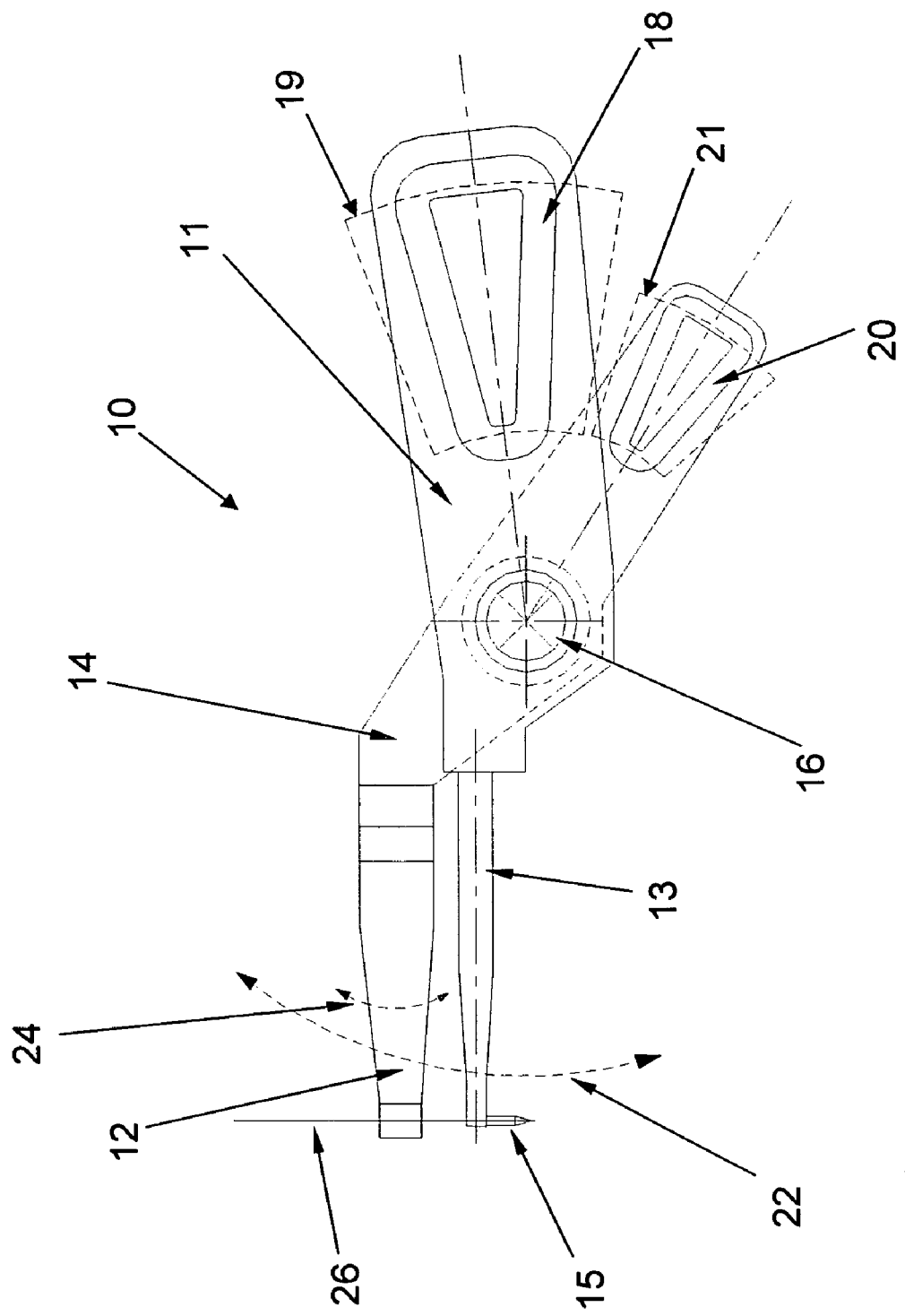
FIG. 2 is a side view of a bondhead according to a first preferred embodiment of the invention.

FIG. 2 is a side view of a bondhead 10 according to a first preferred embodiment of the invention. The bondhead 10 comprises a bondhead body 11, to which is mounted a bonding tool, preferably an ultrasonic transducer 13, with a capillary 15 attached to one end of the transducer 13. The bondhead body 11 is mounted on a bondhead pivot 16 approximately near a center of gravity of the bondhead assembly. This allows the capillary 15 to be movable towards and away from a bonding position in a generally up and down motion about the bondhead pivot 16 in a pivotal motion. The bondhead body 11 is coupled to a bondhead actuator, such as a voice coil motor comprising a coil bracket 18 disposed between and movable relative to permanent magnets 19 by way of electromagnetic interaction, for controlling movement of the transducer 13 and capillary 15. The movement of the transducer 13 and capillary 15 is along a first turning arc 22.

Also mounted on the bondhead pivot 16 is a wire clamping device, such as a wire clamp holder 14 comprising a wire clamp 12 at one end located along a path of a length of bonding wire 26 to clamp it. The wire clamp holder 14 is mounted such that its mounting axis passes through the bondhead body 11 and is movable about the bondhead pivot 16 relative to the bondhead body 11. In this embodiment, the mounting axis thus corresponds to a pivoting axis at the bondhead pivot 16. Its pivotal movement is controlled by a wire clamping device actuator, which may also be in the form of a voice coil motor comprising a coil bracket 20 disposed between permanent magnets 21 and movable with respect thereto. It should be appreciated that other forms of actuators, including without limitation other types of linear motors, piezoelectric motors or pneumatic motors, are applicable for implementing a bondhead according to the invention. Moreover, other driving mechanism such as DC servomotors and lead screw mechanisms may be used.

The movement of the wire clamp 12 is along a second turning arc 24. Although the wire clamp holder 14 and the bondhead body 11 share the same turning axis about the bondhead pivot 16, they are preferably mounted on a pivot axis of the pivot 16 at different points so that their motions are decoupled.

As the bondhead body 11 and wire clamp holder 14 are driven by separate actuators, they are capable of independent movement and are driven independently. Thus, the position of the wire clamp 12 is not constrained by the position of the bondhead 10 as in the prior art. Vertical motion of the wire clamp 12 with respect to the transducer 13 can feed bonding wire 26 upwards or downwards through the capillary 15 on the transducer 13 independently of the bondhead body 11. An advantage of this first preferred embodiment of the invention is that the bondhead body 11 and wire clamp holder 14 pivot about a common axis, namely the bondhead pivot 16 or pivot axis to which both said components are mounted. This allows easier coordination of the relative movements of the bondhead body 11 including the transducer 13 and capillary 15 on the one hand, and the wire clamping device including the wire clamp holder 14 and the wire clamp 12 on the other.

The motion control of the wire clamp 12 can be either designed on an open loop system without feedback sensing, or on a closed-loop feedback system. Although the bondhead bodies and wire clamping devices are configured to move in pivotal motions in the described embodiment, it should be appreciated that the bondhead body and wire clamping devices respectively may be configured and actuated to move in linear motions instead.

Figure 3:
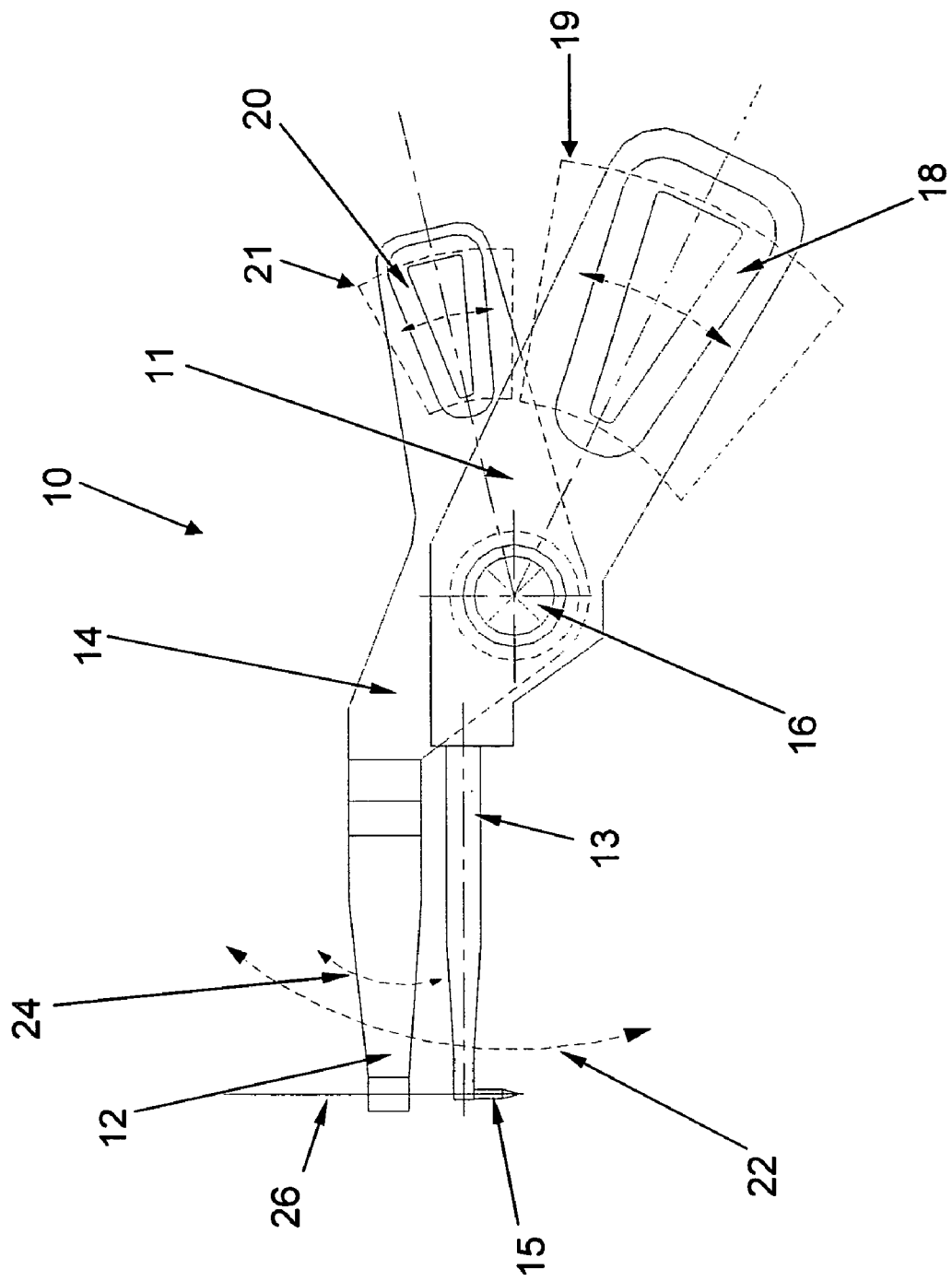
FIG. 3 is a side view of a bondhead according to a second preferred embodiment of the invention.

FIG. 3 is a side view of a bondhead 10 according to a second preferred embodiment of the invention. In this second embodiment, the wire clamp body 14 has a different shape as compared to the first embodiment. Essentially, the wire clamping device actuator is arranged so that the wire clamping device actuator, comprising the coil bracket 20 and permanent magnets 21, is positioned higher than the bondhead body actuator, whereas the bondhead body actuator is positioned higher than the wire clamping device actuator in the first embodiment. As the second embodiment functions in a substantially similar manner to the first embodiment, it will not be further elaborated upon. The choice of embodiment to adopt would depend on the configuration of the wire bonder itself, and the manner in which it would be more convenient to locate the wire clamping device actuator relative to the bondhead body actuator.

Figure 4:
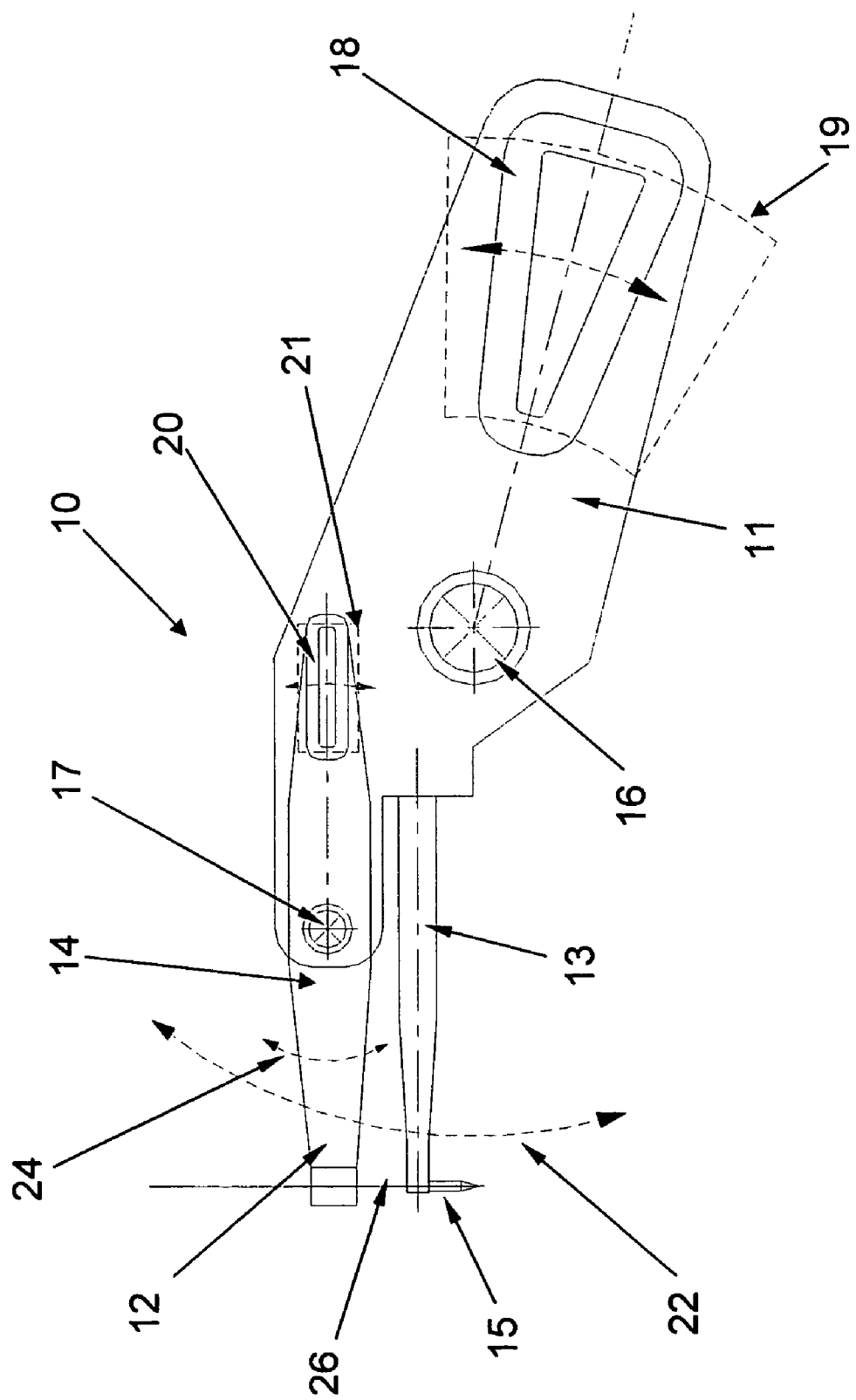
FIG. 4 is a side view of a bondhead according to a third preferred embodiment of the invention.

FIG. 4 is a side view of a bondhead 10 according to a third preferred embodiment of the invention. In this embodiment, the bondhead body 11 is mounted on a bondhead pivot 16, but the wire clamp holder 14 is mounted on a separate wire clamp pivot 17 located elsewhere on the bondhead body 11. Again, the bondhead body 11 is driven by a bondhead actuator comprising a coil bracket 18 disposed between permanent magnets 19 and movable with respect thereto by way of electromagnetic interaction. The wire clamp holder 14 is driven by a wire clamping device actuator comprising a coil bracket 20 disposed between permanent magnets 21 and movable with respect thereto. Both actuators are capable of independent movement. However, the turning axes of the bondhead body 11 and wire clamp holder 14 are different because they are fixed at separate locations on the bondhead body 11. The operational parameters should be modified accordingly to take into account the modified turning arcs 22, 24.

Figure 5:
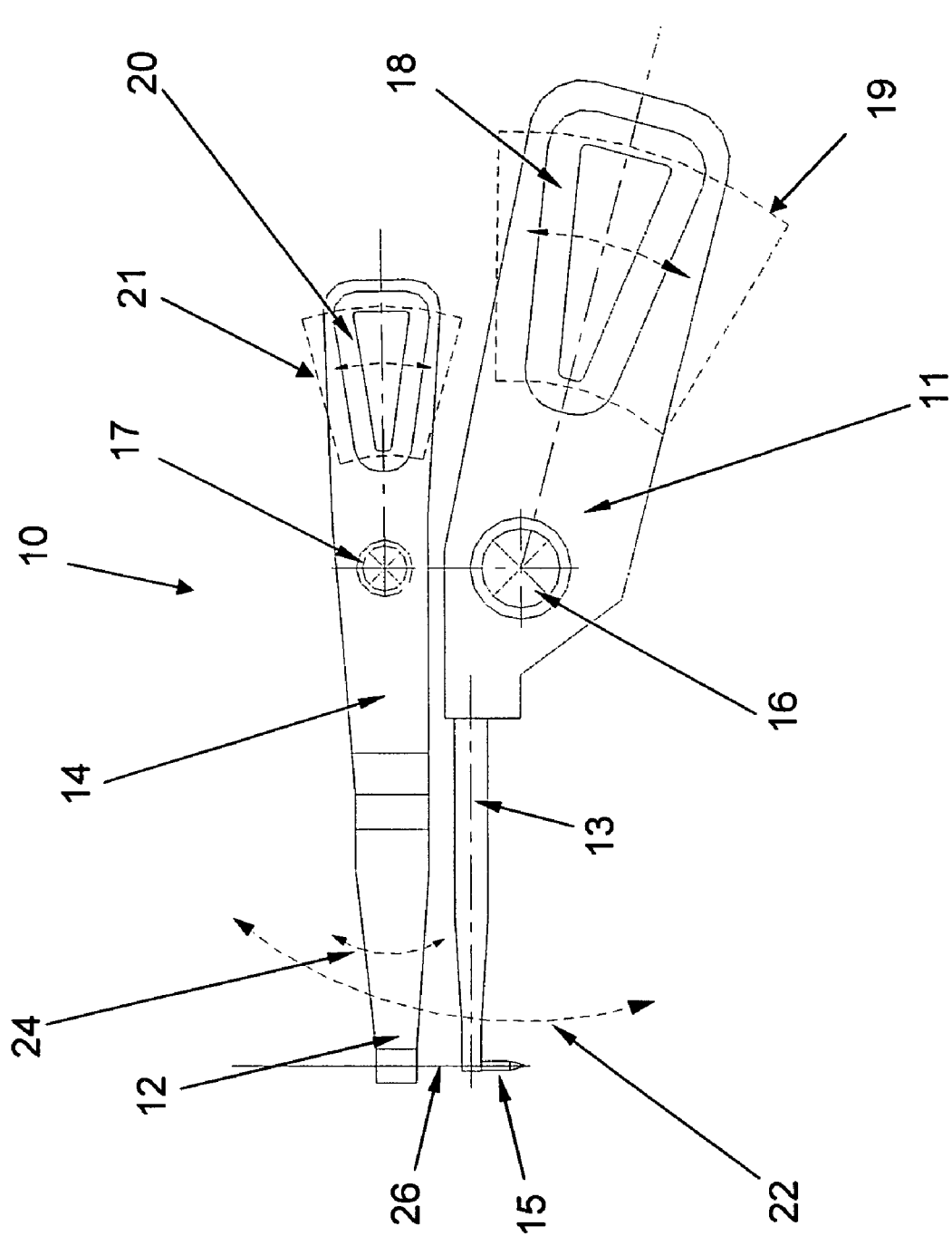
FIG. 5 is a side view of a bondhead according to a fourth preferred embodiment of the invention.

FIG. 5 is a side view of a bondhead 10 according to a fourth preferred embodiment of the invention. In this embodiment, the wire clamp holder 14 is mounted such that its mounting axis (which is the same as its pivoting axis) does not pass through the bondhead body 11. The mounting axis passes through a wire clamp pivot 17 at a location that comprises a pivoting structure that is separate from the bondhead body 11. The wire clamp holder 14 is configured for pivotal movement relative to the bondhead body 11. The turning arcs 22, 24 are again different from the other embodiments. In other respects, the design and working principles are similar to the previous embodiment and will not be further elaborated upon.

Figure 6:
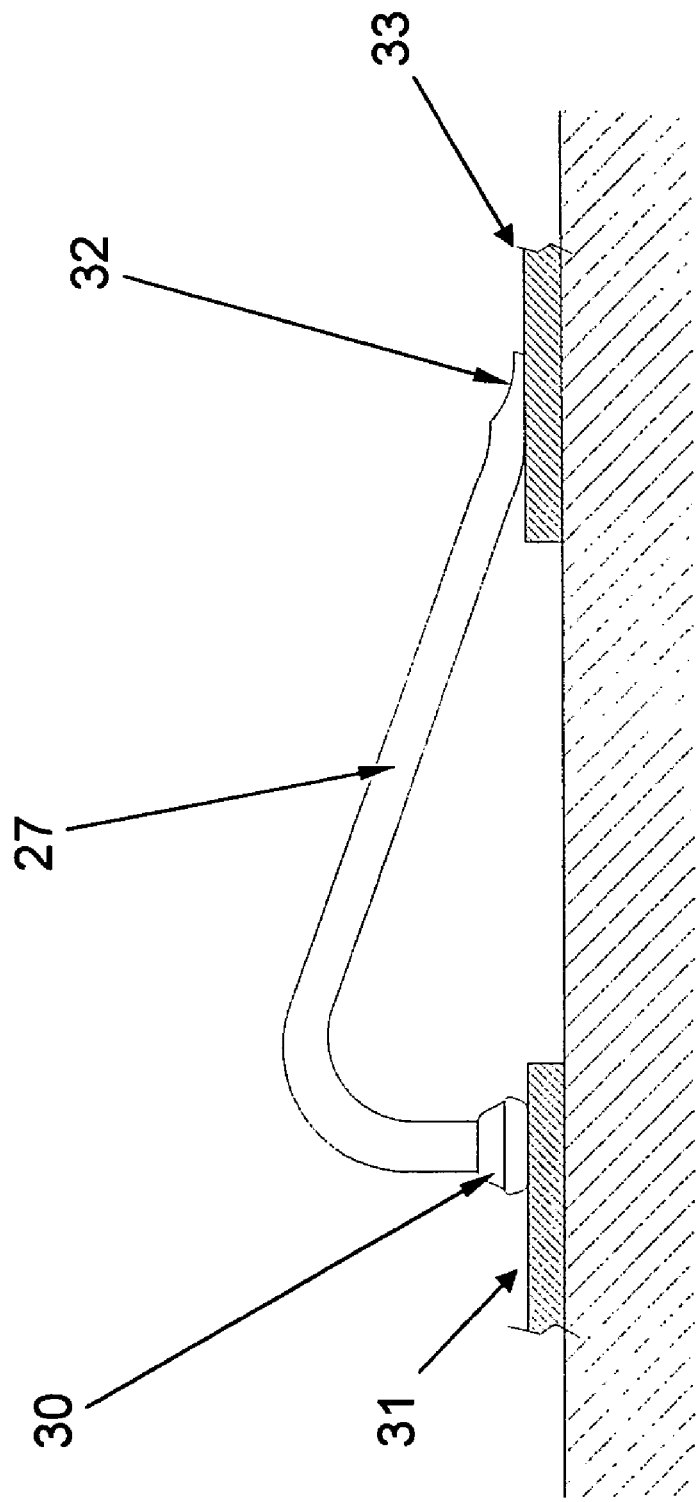
FIG. 6 is a side view of a typical wire loop formed when electrically connecting two bond pads at different bonding locations.

FIG. 6 is a side view of a typical wire loop 27 formed when electrically connecting a first bond pad 31 to a second bond pad 33 at different bonding locations. A first bond is made at the first bond pad 31 using a ball bond 30. The capillary 15 is then moved to the second bond pad 33, at which a wedge bond 32 is formed to complete the electrical connection between the first bond pad 31 and the second bond pad 33. A variety of programmed motions are used by the capillary 15 when moving from the first bond pad 31 to the second bond pad 33 to shape the wire loop 27. A ball bond would next be formed by the capillary 15 at another bond pad (not shown) at the next bonding location.

Figure 7:
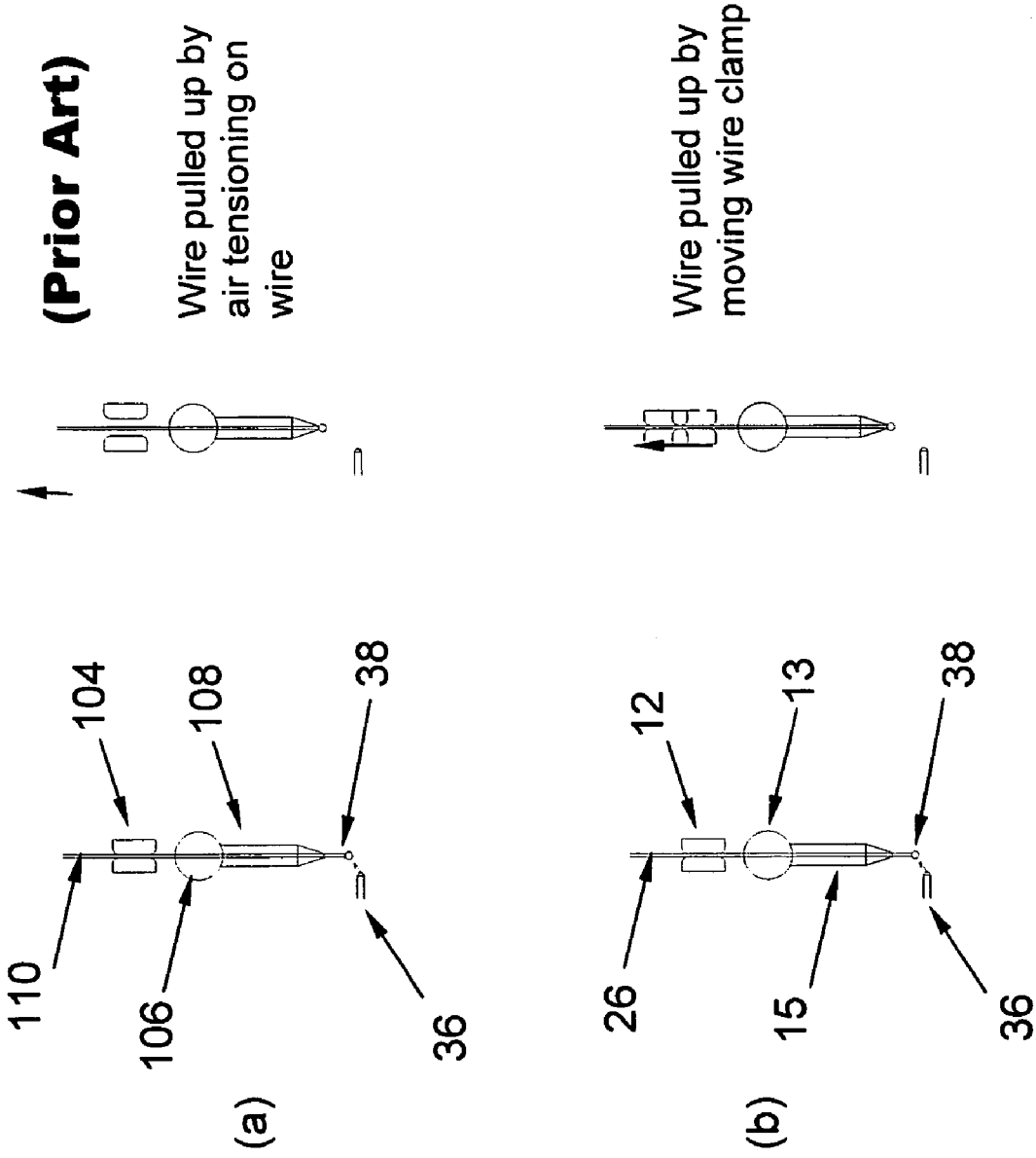
FIGS. 7(a) and 7(b) are cross-sectional side view representations of the pulling and centering of a molten ball after EFO using an air tensioner, and performing the same operation using a bondhead according to a preferred embodiment of the invention respectively.

FIGS. 7(a) and 7(b) are cross-sectional side view representations of the pulling and centering of a molten ball after EFO using an air tensioner, and performing the same operation using a bondhead according to a preferred embodiment of the invention respectively. Referring first to FIG. 7(a), which is a prior art design, an EFO device 36 produces an electrical spark to form a molten ball 38 at the tail end of a length of bonding wire 110 controlled by a wire clamp 104 and threaded through a transducer 106 and capillary 108. After the molten ball 38 is formed, the molten ball 38 has to be located at the mouth of the capillary 108, and this can be done by using air tensioning to pull the wire up. The wire clamp 104 is open during said air tensioning.

Referring now to FIG. 7(b), the EFO device 36 produces an electrical spark to form a molten ball 38 at the tail end of a length of bonding wire 26. The bonding wire 26 is controlled by a wire clamp 12 and threaded through a transducer 13 and capillary 15. To position the molten ball 38 at the mouth of the capillary 15, the wire clamp 12 is closed and the bonding wire 26 is pulled up by the wire clamp 12. Pulling the bonding wire 26 using the wire clamp 12 is more precise than using an air tensioner, and avoids causing damage to the bonding wire 26 or molten ball 38.

Figure 8:
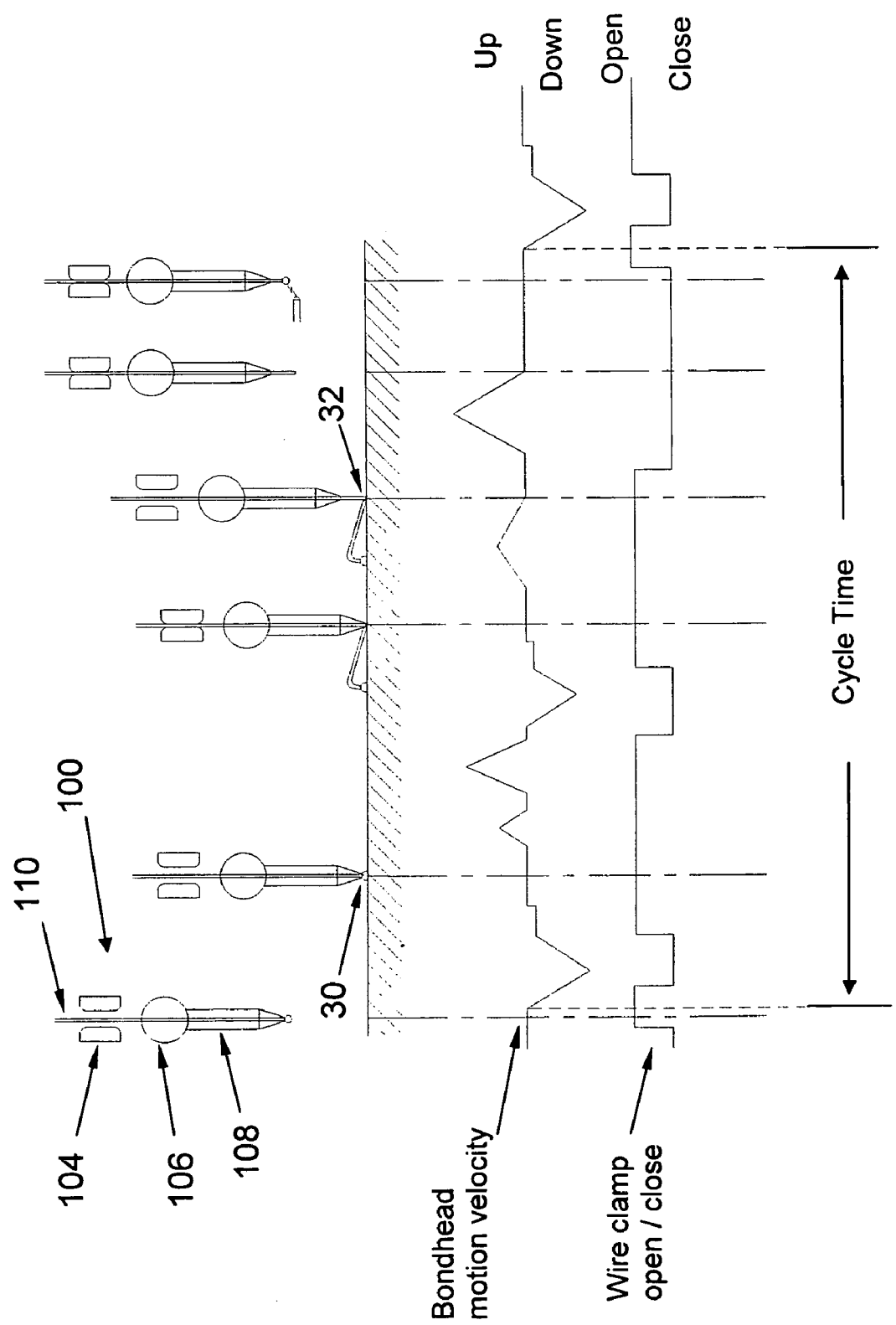
FIG. 8 shows a bonding sequence using the prior art bondhead.

FIG. 8 shows a bonding sequence using the prior art bondhead 100. After formation of the molten ball 38, the bonding wire 110 is pulled upwards by air tensioning so that the molten ball 38 is positioned at the mouth of the capillary 108, as described with respect to FIG. 7(a). The molten ball 38 is lowered onto a first bond pad to form a ball bond 30. The capillary 108 is then moved to a second bond pad to form a wedge bond 32. Thereafter, the capillary 108 is lifted by a certain distance with the wire clamp open in order to leave a tail end of the bonding wire 110 hanging from the mouth of the capillary 108, then the wire clamp 104 closes and the bonding wire 110 is pulled to break it from the wedge bond 32. The lifting of the transducer 106 and capillary 108 is done by lifting the whole bondhead 100. Tail formation of the bonding wire 110 is necessary for the EFO to form a molten ball 38 to create a ball bond at the next bonding location. The additional step of raising the capillary 108 with the wire clamp 12 open for tail formation results in increased cycle time.

Figure 9:
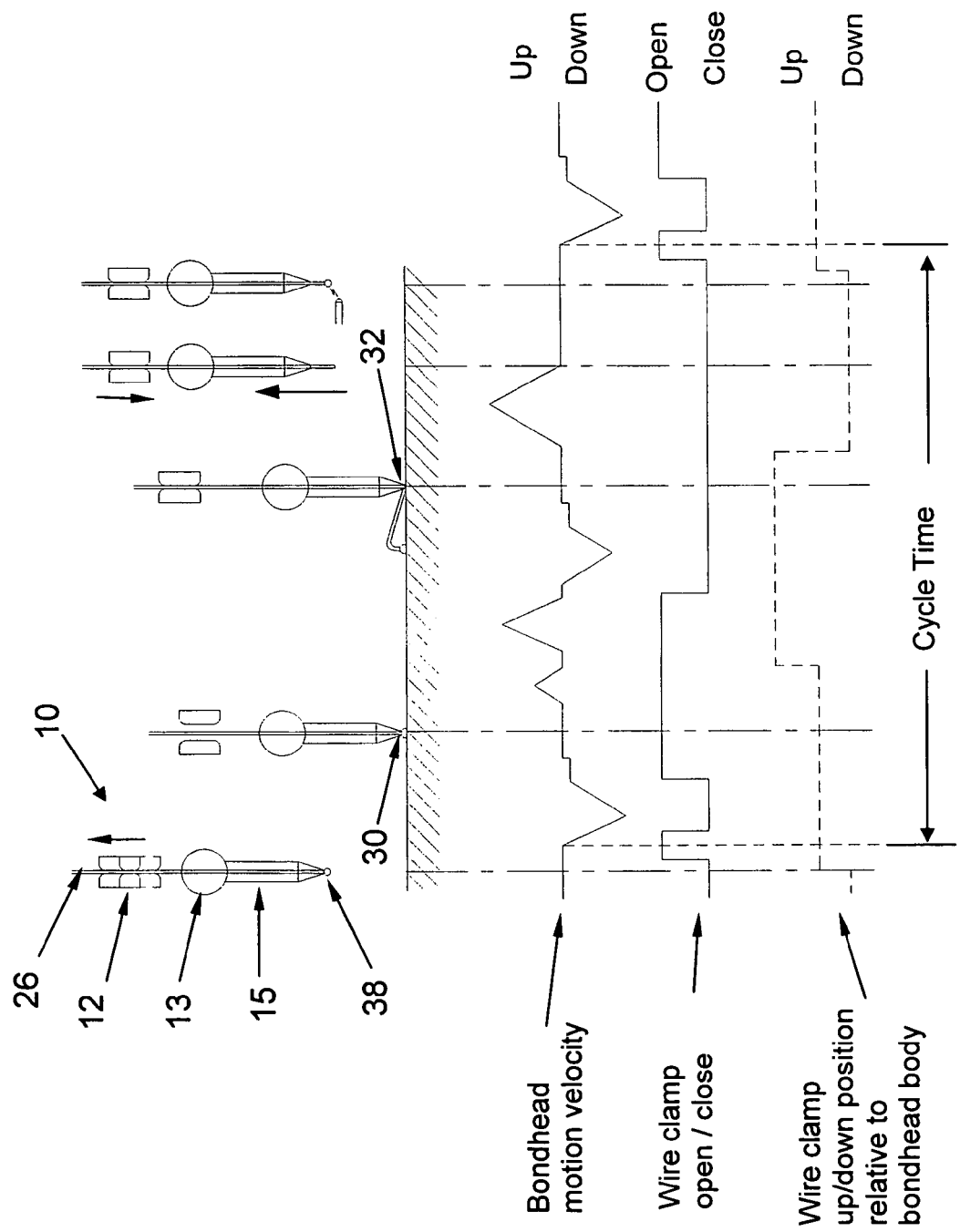
FIG. 9 shows a bonding sequence using a bondhead according to a preferred embodiment of the invention.

FIG. 9 shows a bonding sequence using a bondhead 10 according to a preferred embodiment of the invention. After formation of the molten ball 38, the bonding wire 26 is pulled upwards by the wire clamp 12 in a direction away from the transducer 13 so that the molten ball 38 is positioned at the mouth of the capillary 15, as described with respect to FIG. 7(b). The molten ball 38 is lowered onto a first bond pad to form a ball bond 30. The capillary 15 is then moved to a second bond pad to form a wedge bond 32. Thereafter, the transducer 13 and capillary 15 are lifted by the bondhead body 11 away from the wedge bond 32 while the wire clamp 12 is closed and clamping the bonding wire 26, thereby releasing a length of bonding wire 26 between the wedge bond 32 and the capillary 15 to form the tail wire. At the same time, the closed wire clamp 12 preferably moves down in the direction of the transducer 13 whereby to increase the length of bonding wire 26 released between the wedge bond 32 and the capillary 15 that is hanging out at the mouth of the capillary 15. The total traveling distance of the wire clamp 12 and capillary 15 can be made equal to the tail length desired. Thereafter, the wire clamp 12 and transducer 13 move away from the wedge bond 32 together while clamping the bonding wire so as to break and separate the bonding wire 26 from the wedge bond 32. With the tail wire produced, the EFO device then produces an electrical spark to form another molten ball 38 on the bonding wire 26, and the next ball bond 30 can be formed with the molten ball 38 as described above.

Instead of having to raise the whole bondhead 10 with the wire clamp 12 open to create a tail of protruding wire, and then closing the wire clamp 12 to break the wire 26, tail formation is performed with the wire clamp 12 closed. Tail wire formation is assisted by the wire clamp 12 pulling bonding wire 26 through the capillary 15, so that the bondhead body 11 may travel for a shorter distance. As a result, a tail wire is formed without start and stop motions of the bondhead 10 and opening and closing of the wire clamp 12, as in the prior art. Bonding cycle time can be reduced.

It should be appreciated that the wire clamp 12 according to the preferred embodiments of the invention is movable relative to the transducer 13 mounted on the bondhead 10, so that less bondhead manipulation is necessary to control a length of bonding wire 26 fed to the capillary tip. The bonding wire 26 is assisted directly by the wire clamp 12 to be fed through the capillary 15 for better control of the tail end of bonding wire 26 protruding from the capillary tip.

Further, the preferred embodiments reduce vulnerability of the molten ball 38 to damage during ball centering caused by air tensioning forces. Centering between the bonding wire 26 and the molten ball 38 with respect to the capillary tip, and thus the position of the ball bond 30, can be more accurate. Stoppages of the bonding system due to premature breaking of the bonding wire 26 or a missing tail wire induced by motion of the tail wire at high bonding speeds can also be reduced, so that bonding system stability is increased. Moreover, overall bonding cycle time is reduced for faster operation.

The invention described herein is susceptible to variations, modifications and/or additions other than those specifically described and it is to be understood that the invention includes all such variations, modifications and/or additions which fall within the spirit and scope of the above description.

The invention claimed is:

1. A bondhead comprising:
   a bonding tool;
   a bondhead body for mounting the bonding tool to the bondhead body;
   a bondhead actuator coupled to the bondhead body and operable for moving the bondhead body and correspondingly moving the bonding tool with respect to a bonding surface;
   a wire clamping device operable to selectively clamp and release clamping of bonding wire, the wire clamping device being so mounted and arranged as to be movable relative to the bondhead body in directions towards and away from bonding tool and the bonding surface; and
   a wire clamping device actuator coupled to the wire clamping device and being operative to move the wire clamping device relative to the bondhead body towards the bonding tool for feeding bonding wire to the bonding tool.

2. The bondhead as claimed in claim 1, wherein the wire clamping device has a mounting axis passing through the bondhead body.

3. The bondhead as claimed in claim 2, wherein the wire clamping device has a respective pivoting axis positioned and configured for pivotal movement of the clamping device relative to the bondhead body.

4. The bondhead as claimed in claim 3, wherein the bondhead body is also configured for pivotal movement on a turning axis.

5. The bondhead as claimed in claim 4, wherein the wire clamping device and the bondhead body are mounted on a same axis as the pivoting axis and the turning axis.

6. The bondhead as claimed in claim 3, wherein the bondhead body is configured for pivotal movement and the wire clamping device pivoting axis is a different axis from the turning axis of the bondhead body.

7. The bondhead as claimed in claim 1, wherein the wire clamping device has a mounting axis that does not pass through the bondhead body.

8. The bondhead as claimed in claim 7, wherein the wire clamping device is configured for pivotal movement at the mounting axis relative to the bondhead body.

9. The bondhead as claimed in claim 1, wherein the wire clamping device actuator comprises a voice coil motor.

10. The bondhead as claimed in claim 1, wherein the wire clamping device actuator comprises a motor selected from the group consisting of a linear motor, a piezoelectric motor and a pneumatic motor.

11. The bondhead as claimed in claim 1, wherein the bonding tool is an ultrasonic transducer.

12. The bondhead as claimed in claim 1, wherein the wire clamping device actuator is positioned at a higher position than the bondhead actuator.

13. The bondhead as claimed in claim 1, wherein the wire clamping device actuator is positioned at a lower position than the bondhead actuator.

14. Method of bonding a wire to a bonding surface comprising the steps of:
   forming a wire bond at the bonding surface with a bonding tool;
   moving the bonding tool away from the wire bond while clamping the wire with a wire clamping device so as to release a predetermined length of wire between the wire bond and the bonding tool without separating the bonding wire from the wire bond; and thereafter
   clamping the wire with the wire clamping device, and then moving the clamping device and the bonding tool away from the wire bond while clamping the wire to separate the bonding wire from the wire bond.

15. The method as claimed in claim 14, further including the step of moving the clamping device to pull the wire in the direction of the bonding tool while the bonding tool is releasing the length of wires whereby to increase the length of wire released between the wire bond and the bonding tool.

16. The method as claimed in claim 14, including producing an electric spark to form a molten ball on the length of wire, then bringing the molten ball to contact the bonding tool by using the clamping device to clamp and pull the wire in a direction away from the bonding tool.

17. The method as claimed in claim 16, including making a ball bond comprising the molten ball on the bonding surface.

18. The bondhead as claimed in claim 4, wherein the wire clamping device and the bondhead body share the pivoting axis of the wire clamping device and the turning axis of the bondhead body.

* * * * *